(12) United States Patent
Jan et al.

(10) Patent No.: US 6,287,983 B2
(45) Date of Patent: *Sep. 11, 2001

(54) SELECTIVE NITRIDE ETCHING WITH SILICATE ION PRE-LOADING

(75) Inventors: Der'E Jan, Plano, TX (US); Thomas M. Parrill, North Andover, MA (US); Brian K. Kirkpatrick, Allen, TX (US)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/213,143

(22) Filed: Dec. 18, 1998

Related U.S. Application Data

(60) Provisional application No. 60/070,226, filed on Dec. 31, 1997.

(51) Int. Cl.[7] .................. H01L 21/302; H01L 21/461
(52) U.S. Cl. .................... 438/745; 438/756; 438/757
(58) Field of Search ................... 438/765, 756, 438/757; 216/96, 99, 103

(56) References Cited

U.S. PATENT DOCUMENTS

| | | | |
|---|---|---|---|
| 3,607,480 | * 9/1971 | Harrap et al. | 438/757 |
| 3,635,774 | * 1/1972 | Ohta | 438/757 |
| 4,092,211 | * 5/1978 | Morris | 216/51 |
| 4,269,654 | * 5/1981 | Deckert et al. | 438/757 |
| 5,188,701 | * 2/1993 | Hirano | 438/757 |
| 5,472,562 | * 12/1995 | Ziger | 438/703 |
| 5,918,134 | * 6/1999 | Gardner et al. | 438/757 |

OTHER PUBLICATIONS

Wolheiter, V. D., "Silicon nitride Ledge Removal Techniques for Integrated Circuit Devices", J. Electrochemical Society: Solid–State Science and technology, pp. 1736–1738, Dec. 1975.

* cited by examiner

Primary Examiner—Benjamin L. Utech
Assistant Examiner—Duy-vu Deo
(74) Attorney, Agent, or Firm—W. James Brady III; Frederick J. Telecky, Jr.

(57) ABSTRACT

A nitride wet etch in which liquid TEOS is flowed directly into the hot phosphoric acid bath before wafer etching begins. This preloads the bath chemistry with silicate ions, and thus helps assure very high selectivity to silicon oxides.

2 Claims, 1 Drawing Sheet

SELECTIVE NITRIDE ETCHING WITH SILICATE ION PRE-LOADING

This application claims priority under 35 USC §119(e)(1) of provisional application Ser. No. 60/070,226 filed Dec. 31, 1997.

BACKGROUND AND SUMMARY OF THE INVENTION

The present invention relates to integrated circuit fabrication methods, and particularly to wet etching methods for selectively etching silicon nitride.

BACKGROUND: SELECTIVE NITRIDE ETCHING

One of the very useful basic steps in integrated circuit processing is the ability to remove silicon nitride selectively with respect to silicon dioxide. Conventionally, a hot phosphoric acid bath is used to etch silicon nitride. However, a basic problem is that the nitride/oxide selectivity changes during the course of an etching cycle. (When the bath is new, it will achieve a nitride-to-oxide selectivity of only about 5 to 1. As the bath continues to etch nitride, the selectivity will improve by a factor of 20 or more.)

This presents problems in process controllability. To compensate for such loading effects, it may be necessary to continually adjust the chemistry of the bath, or to precondition a bath before it is used, or to discard a bath early.

One proposed approach to this problem was a four-step procedure, for silicon nitride strip in phosphoric acid, described in U.S. Pat. No. 5,188,701 to Yoshio, which is hereby incorporated by reference. In this method, a complex procedures was used to control the concentration and temperature of phosphoric acid. The complexity of this method is a significant drawback.

V. D. Wohlheiter used a mixed solution of phosphoric acid and sulfuric acid to etch silicon nitride and effectively passivate the exposed n+ silicon surface. See Wohlheiter, "Silicon Nitride Ledge Removal Techniques for Integrated Circuit Devices," 122 J. Electrochem. Soc. 1736 (1975), which is hereby incorporated by reference. However, that method requires a significant shift in the chemistry, which is undesirable.

NITRIDE ETCHING WITH SILICATE ION PRE-LOADING

The present application discloses a new method for etching silicon nitride selectively with respect to silicon oxides. According to this method, a source of silicate ions is added to the hot phosphoric acid bath immediately, as a way to directly precondition it before wafers are etched. Preferably the silicate ion source is a liquid such as "TEOS" (tetraethoxysilane). It has been found that the oxide etching rate is determined by the concentration of silicic acid, and that the concentration of silicic acid has essentially no effect on the nitride etching rate. Thus, by preloading the bath with silicic acid, the nitride-to-oxide selectivity is very good, even at the start of etching with a new bath, or after fresh chemicals are added. Preferably, the loading of the bath is accomplished by injecting liquid TEOS directly into the hot phosphoric acid bath below its surface. The temperature of the bath is actually above the flashpoint of TEOS in air, but the injected TEOS reacts rapidly with the acid bath to form silicic acid. In one example, injection of 125 cc of TEOS into a forty liter bath of hot phosphoric acid has been found to reduce the silicon dioxide etching rate to approximately zero.

Advantages of the disclosed inventions include: better control over wet etching of integrated circuits having silicon nitrides and silicon oxides on their surfaces; more efficient use of chemicals; the ability to use undensified oxides; and consistently achievable high nitride:oxide selectivity.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Process Overview

Figure 1:
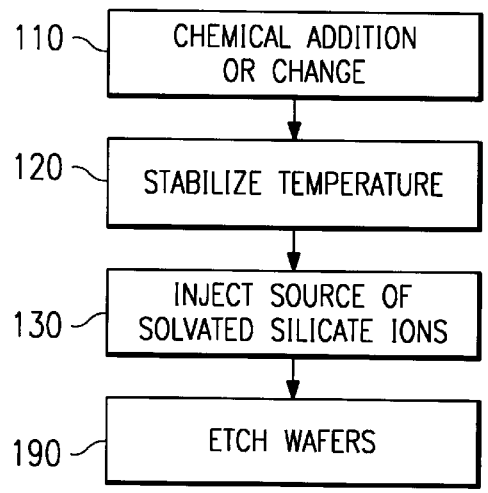
FIG. 1 is a flow chart of the disclosed embodiments.

FIG. 1 shows some key steps in the process. After chemicals are added to the bath or the bath is changed out (step 110), the temperature is allowed to stabilize if it has gone out of range (step 120). A liquid silicic acid precursor, such as TEOS, is introduced into the solution, in sufficient concentration to bring the concentration of solvated silicate ions to at least 0.01 molar. Thereafter wafer etching can proceed conventionally (step 190).

Experimental Results with Prior Art Methods

The following data show the weaknesses of prior art methods.

These data show how the etch rates of APCVD oxide and nitride varied as a function of the number of nitride lots etched in an $H_3PO_4$ bath at a temperature of 155 degrees C.:

After 0 lots (of Nitride Film) had been etched in an $H_3PO_4$ Batch, the measured etch rates were:

Etch Rate of APCVD Oxide: 9–10 Angstroms/min;
  Etch Rate of Silicon Nitride: 45–48 Angstroms/min.

After 5 lots (of Nitride Film) had been etched in $H_3PO_4$ Batch, the measured etch rates were:

Etch Rate of APCVD Oxide: 7–8 Angstroms/min;
  Etch Rate of Silicon Nitride: 45–48 Angstroms/min.

After 10 lots (of Nitride Film) had been etched in $H_3PO_4$ Batch, the measured etch rates were:

Etch Rate of APCVD Oxide: 3–4 Angstroms/min;
  Etch Rate of Silicon Nitride: 45–48 Angstroms/min.

After 17 lots (of Nitride Film) had been etched in $H_3PO_4$ Batch, the measured etch rates were:

Etch Rate of APCVD Oxide: 0–1 Angstroms/min;
  Etch Rate of Silicon Nitride: 45–48 Angstroms/min.

Experimental Results with TEOS Injection, and Sample Process Context

The disclosed nitride stripping process is expected to be advantageous in many contexts. One example (among many) is in the context of a shallow trench isolation (STI) process.

Figure 2:
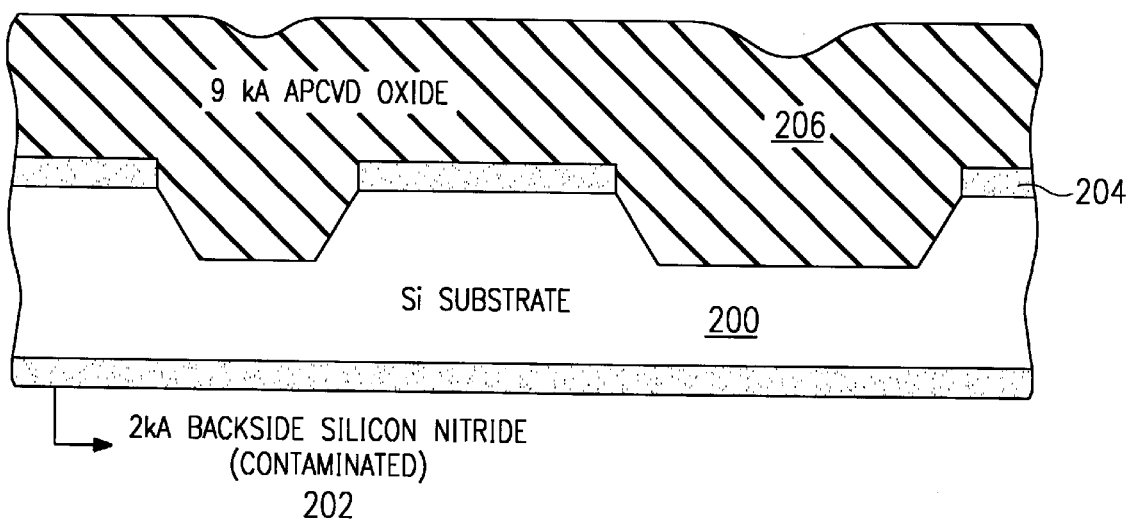
FIG. 2 shows an intermediate stage in a shallow trench isolation process where the process of FIG. 1 can be used advantageously.

FIG. 2 shows an intermediate stage in a shallow trench isolation process where the process of FIG. 1 can be used advantageously.

Some STI processes use a backside nitride strip to remove the backside nitride (which includes metallic contamination) after the APCVD TEOS is filled into the trench. Since the APCVD TEOS is not densified, the TEOS can be significantly etched in hot phosphoric acid during the backside silicon nitride strip. The phosphoric acid at a temperature of 155 C. etched the undensified APCVD TEOS at a wide range of 1 nm/min to less than 0.05 nm/min, depending on how much volume of silicon nitride films has been etched in the batch. By contrast, a pre-loaded hot phosphoric acid bath, prepared with TEOS using the present invention, was found to keep the etch rates of TEOS and silicon nitride in 155 C. phosphoric acid at constant values of 0.5 and 48 Angstroms per minute respectively.

From experiments it was found that 125 cc of TEOS, injected into 40 liters of phosphoric acid (85% wt) at 155 degrees C., takes the oxide etch rate to approximately zero. Thus this test was found to provide a silicon nitride wet etch with essentially infinite selectivity to oxide.

According to a disclosed class of innovative embodiments, there is provided: A method for wet-etching integrated circuit structures which contain both silicon nitride portions and silicon oxide portions, comprising the steps of: (a.) preparing an etchant bath which predominantly comprises hot phosphoric acid; (b.) introducing a liquid-phase precursor of silicic acid into said bath; and (c.) after said steps (a.) and (b.), placing partially fabricated integrated circuit wafers into said bath to perform selective etching, with a nitride:oxide selectivity which is greater than fifty-to-one at all times.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

For example, the description of phosphoric acid and silicic acid does not preclude the use of other components in the solution, such as silicic acid, H2Si2O3, which may dissolve in hot phosphoric acid to produce silicate ions.

Optionally, it is also possible to perform other preconditioning steps after the TEOS injection of the preferred embodiment. For example, in one class of embodiments a clean sacrificial wafer is used, after the TEOS injection, each time new chemicals are added.

However, an important advantage of the invention is that long preconditioning cycles are no longer necessary.

The present invention also provides process engineers with some additional flexibility regarding temperature. Increasing temperature is one technique for increasing selectivity to oxides, but it is very difficult to recirculate and filter phosphoric acid above 160 C. Since the methods described above improve control over selectivity (and provide better assurance that a certain level of minimum selectivity will be achieved), process engineers may be able to lower temperature slightly.

What is claimed is:

1. A method for wet-etching integrated circuit structures that contain both silicon nitride and silicon oxide portions, comprising the steps of:

(a.) preparing an etchant bath that predominantly comprises hot phosphoric acid at a temperature above the flash point of liquid TEOS in air;

(b.) injecting, directly into said bath below its surface, a liquid-phase precursor of silicic acid, the precursor comprising liquid TEOS; and (c.) after said steps (a.) and (b.), placing partially fabricated integrated circuit wafers into said bath to selectively etch silicon nitride portions of the integrated circuit structure relative to the silicon oxide portions.

2. The method of claim 1, wherein said step (b.) increases the silicic acid concentration of said bath to greater than 0.01 molar prior to said step (c.).

* * * * *